United States Patent [19]

Shirasaki et al.

[11] Patent Number: 5,734,008
[45] Date of Patent: Mar. 31, 1998

[54] POLYIMIDE FILM

[75] Inventors: Mika Shirasaki, Tsukuba; Youichi Ueda, Takatsuki; Mitsuhiro Shibata, Tsukuba-gun, all of Japan

[73] Assignee: Sumitomo Chemical Company, Limited, Osaka, Japan

[21] Appl. No.: 547,535

[22] Filed: Oct. 23, 1995

[30] Foreign Application Priority Data

Oct. 28, 1994 [JP] Japan .................. 6-289021
Dec. 26, 1994 [JP] Japan .................. 6-322839
Aug. 4, 1995 [JP] Japan .................. 7-199553

[51] Int. Cl.$^6$ .................. C08G 73/10
[52] U.S. Cl. .......... 528/353; 528/125; 528/128; 528/170; 528/172; 528/173; 528/174; 528/176; 528/183; 528/185; 528/188; 528/220; 528/229; 528/350; 428/473.5
[58] Field of Search .................. 528/353, 125, 528/128, 170, 172, 173, 174, 176, 183, 185, 188, 220, 229, 350; 428/473.5

[56] References Cited

U.S. PATENT DOCUMENTS 5,084,557  1/1992  Murata et al. .................. 528/353

FOREIGN PATENT DOCUMENTS 0595230  4/1994  European Pat. Off. .
0633282  11/1995  European Pat. Off. .

OTHER PUBLICATIONS

Patent Abstracts of Japan, vol. 18, No. 371 (C–1224), 13 Jul. 1994, & JP–A–06 100508 (Sumitomo Chemical Company Limited).

*Primary Examiner*—P. Hampton-Hightower
*Attorney, Agent, or Firm*—Watson Cole Stevens Davis, P.L.L.C.

[57] ABSTRACT

The polyimide film of this invention is formed from a polyimide, which is prepared by reacting a diamino compound represented by the general formula (1):

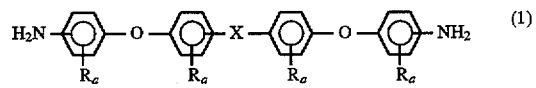

wherein X represents a hydrocarbon group having 1 to 20 carbon atoms or a sulfur atom; R represents each independently a halogen atom, a hydrocarbon group having 1 to 6 carbon atoms or a halogen-containing hydrocarbon group having 1 to 6 carbon atoms; a represents each independently an integer of 0 to 4;

with a tetracarboxylic dianhydride represented by the general formula (2)

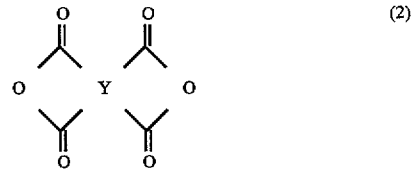

wherein Y represents a tetravalent organic group having 2 or more carbon atoms.

The polyimide film obtained can be applied favorably to a flexible printed circuit board without adhesion layer, a protective coating for electronic parts and electric wires, or a heat resistant adhesive.

2 Claims, No Drawings

POLYIMIDE FILM

BACKGROUND OF THE INVENTION

The present invention relates to a novel polyimide film and the use thereof, More particularly, the invention relates to a polyimide film having high heat resistance, high adhesiveness, good insulating property, low moisture absorption, low dielectric property and good processability, and the polyimide film is utilized in flexible printed circuit boards, protective films for electronic parts or electric wires, and heat resistant adhesions, Polyimides are often used in electric and electronic fields utilizing their high heat resistance and excellent characteristics in respect of mechanical strength and electrical insulating properties. Polyimides are used mainly as flexible printed circuit boards, TAB (Tape Automated bonding), protective films for semiconductors and various wiring printed boards, insulating films between layers, and films for electric wires and cables.

Uses of flexible printed circuit boards have been extending along with the tendency of making electronic parts smaller and lighter. Conventional flexible printed circuit boards are composed of three layers, e.g., metal foil circuit layer, polyimide film layer and adhesion layer. However, the heat resistant character of flexible printed circuit boards are not satisfactorily enough, because of the low heat-resistivity of the adhesion layer.

Recently, as a method of production of two-layer flexible printed circuit boards without adhesion layer, varnish of polyamic acid which is a precursor of polyimide is cast into a film on a metal foil, and the film is then heated for imidization. However, polyamic acid is easily hydrolyzable, relatively unstable in long-term storage and deteriorated with heating over 300° C. during imidization, causing reduction of productivity and reliability in the production of two-layer flexible printed circuit boards. As another method of production of two-layer flexible printed circuit boards, a conductive layer can be formed on a polyimide film by vapor-deposition or spattering, but there have been problems that the adhesive strength between the film and the conductive layer is low, and the thickness and the density of the conductive layer are difficult to keep constant.

A TAB tape, as another use of a layered film composed of a polyimide film and a metal foil, has the same problem described above.

On the other hand, in the use of protective films for semiconductors and various printed wiring boards, insulating films between layers, and films for electric wires and cables, a solution of polyamic acid which is precursor of polyimide, is cast on a substrate and heated to imidization, because polyimides are insoluble to organic solvents. But in this method, the substrate is often corroded by polyamic acid and deteriorated with heating, Shrinkage or bold by water generation occurs in the film during imidization, Moreover, there is a storage unstability problem that the solution of polyamic acid is easily hydrolyzed, and the reliability of this method is lowered. Furthermore, the relatively high moisture absorption of the produced polyimide is also one of the factors of deterioration.

In the field of electric or electronic goods, the thermosetting resins such as epoxy resins, silicon rubbers, acrylic resins and the like, are used as coatings or adhesions. But these thermosetting resin are not sufficient enough in heat resistibility and reliability because they contain large amount of ionic impurities and volatiles, they are highly moisture absorption, and their monomers are unstable. Moreover, there is a problem that thermal curing of them needs longtime and the productivity is low.

Thus, heat resistant polyimide coatings and adhesives have been studied. In a method of using a solution of polyamic acid which is precursor of polyimide, has the problems described above. In a method of compression-molding, high temperature and high pressure are necessary and the processability is low. For making the condition of compression molding mild, polyimides may be modeled by introducing siloxane unit, but this causes the heat resistance low.

SUMMARY OF THE INVENTION

This invention provides a novel polyimide film comprising a specified polyimide which is still soluble in a solvent after imidization reaction without modification. By casting the varnish of the polyimide on a metal foil or a substrate and dried, or by compression-molding of the polyimide film at high temperature onto a metal foil or a substrate, a polyimide film having good processability and high reliability can be obtained and applied to two-layer flexible printed circuit boards, protective coatings and heat resistant adhesions utilizing the high heat resistance, high adhesive strength, good insulating property, low moisture absorption, low dielectric property.

The present inventors have made extensive research for achieving the above object and have consequently found that a polyimide having a specified structure can provide a film of high heat-resistance, high adhesiveness, good insulating property, low moisture absorption, low dielectric property and high processability, and the film is applied favorably to two-layer flexible boards, protective coatings and heat resistant adhesions to complete this invention.

The polyimide film of this invention is formed from a polyimide, which is prepared by reacting a diamino compound represented by the general formula (1):

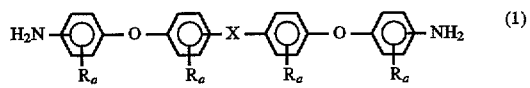

wherein X represents a hydrocarbon group having 1 to 20 carbon atoms or a sulfur atom; R represents each independently a halogen atom, a hydrocarbon group having 1 to 6 carbon atoms or a halogen-containing hydrocarbon group having 1 to 6 carbon atoms; a represents each independently an integer of 0 to 4;

with a tetracarboxylic dianhydride represented by the general formula (2)

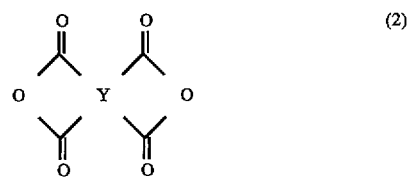

wherein Y represents a tetravalent organic group having 2 or more carbon atoms.

The polyimide film obtained is applied to a flexible printed circuit board without adhesion layer, and a protective coating for electronic parts or electric wires and heat resistant adhesions.

DETAILED DESCRIPTION OF THE INVENTION

In the general formula (1), the halogen atom used as R includes fluorine atom, chlorine atom, bromine atom and iodine atom; the hydrocarbon group having 1 to 6 carbon atoms include hydrocarbon groups, for example, straight or branched chain alkyl groups such as methyl, ethyl, propyl, butyl, pentyl and hexyl; cyclohexyl group; phenyl group and the like, and the halogen-containing hydrocarbon groups having 1 to 6 carbon atoms includes the above-mentioned hydrocarbon groups whose at least one hydrogen atom has been substituted by a halogen atom or halogen atoms.

In the general formula (1), the hydrocarbon group having 1 to 20 carbon atoms used as X includes alkylene groups having 1 to 6 carbon atoms, alkylidene groups having 2 to 14 carbon atoms, phenyl alkylidene groups having 7 to 20 carbon atoms and alicyclic structure-containing hydrocarbon groups having 5 to 20 carbon atoms.

Typical examples of the alkylene group having 1 to 6 carbon atoms include methylene, ethylene and the like; typical examples of the alkylidene group having 2 to 14 carbon atoms include straight and branched chain alkylidene groups such as ethylidene, propylidene, butylidene, pentylidene, hexylidene, heptylidene and the like; typical examples of the phenylalkylidene group having 7 to 20 carbon atoms include straight and branched chain phenylalkylidene groups such as phenylmethylidene, phenylethylidene, phenylpropylidene and the like. Furthermore, typical examples of the alicyclic structure-containing hydrocarbon group having 5 to 20 carbon atoms include groups represented by formulas (b), (c), (d), (e), (f) and (g) and those groups whose at least one hydrogen atom in the alicyclic ring has been substituted by an alkyl group or alkyl groups such as methyl, ethyl and the like:

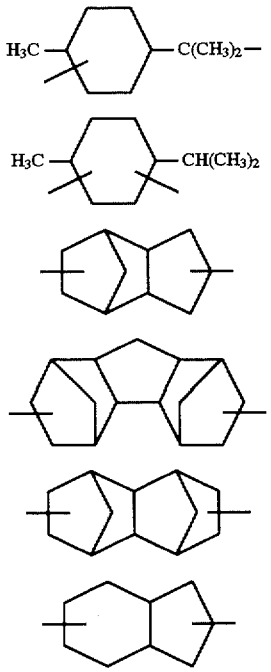

Among the above alicyclic structure-containing hydrocarbon groups, those represented by formulas (b), (c) and (d) are preferred.

Among the diamino compounds represented by the general formula (1), those represented by the formula (a) are also preferred.

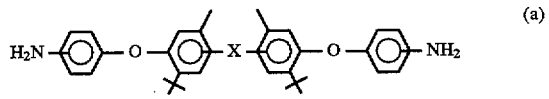

Typical examples of the diamino compounds represented by the general formula (1) are as follows: Bis[4-(4-aminophenoxy)-3-t-butyl-6-ethylphenyl]sulfide, bis[3-(4-aminophenoxy)-3-t-butyl-6-methyl phenyl]sulfide, 1,1-bis [4-(4-aminophenoxy)-3-t-butyl-6-methylphenyl]butane, 1,1-bis[3-(4-aminophenoxy)-3-t-butyl-6-methylpheny] butane, 1,1-bis[4-(4-aminophenoxy)-3-t-butyl-6-methylphenyl]pentane, 1,1-bis[3-(4-amino-phenoxy)-3-t-butyl-6-methylphenyl]pentane, 1,1-bis[4-(4-aminophenoxy) -3-t-butyl-6-methylphenyl]hexane, 1,1-bis[3-(4-aminophenoxy)-3-t-butyl-6-methylphenyl]hexane, 1,1-bis [4-(4-aminophenoxy)-3-t-butyl-6-methyl phenyl]heptane, 1,1-bis[3-(4-aminophenoxy)-3-t-butyl-6-methylphenyl] heptane, bis[4-(4-aminophenoxy) phenyl]menthane, bis[2-(4-amino phenoxy)phenyl]menthane, 1-[2-(4-aminophenoxy) phenyl]-8-[4-(4-amino phenoxy)phenyl] tricyclo[5,2,1,0$^{2,6}$]decane, [2-(3-aminophenoxy)phenyl]-[4-(3-aminophenoxy)phenyl]tricyclo-[5,2,1,0$^{2,6}$]decane, bis[4-(4-aminophenoxy)-3-methylphenyl]tricyclo[5,2,1,0$^{2,6}$] decane, bis[4-(4-aminophenoxy)-3,5-dimethylphenyl] tricyclo[5,2,1,0$^{2,6}$]decane, bis[4-(4-3-aminophenoxy) -3-butyl-6-methylphenyl]tricyclo-[5,2,1,0$^{2,6}$]decane, bis[4-(4-amino-5-methyl phenoxy)-3-methylphenyl]tricyclo[5,2,1,0$^{2,6}$]decane, bis[4-(4-amino-5-methylphenoxy)-3,5-dimethylphenyl]tricyclo[5,2,1,0$^{2,6}$]-decane, bis[4-(4-amino-5-methylphenoxy)-3-butyl-6-methylphenyl]tricyclo[5,2,1, 0$^{2,6}$]decane, bis[2-inophenoxy)phenyl]menthane, bis[4-(3-3-aminophenoxy)phenyl]menthane, bis[2-(3-3-aminophenoxy)phenyl]menthane, 1-[2-(3-amino phenoxy) phenyl]-8-[4-(3-aminophenoxy)phenyl]menthane, bis[4-(4-amino phenoxy)-3-methylphenyl]menthane, bis[4-(4-amino-phenoxy)-3,5-dimethyl phenyl]menthane, bis[4-(4-aminophenoxy)-3-butyl-6-methylphenyl]menthane, bis[4-(4-amino-5-methylphenoxy)-3-methylphenyl]menthane, bis [4-(4-amino-5-methylphenoxy)-3,5-dimethylphenyl] menthane, bis[4-(4-amino-5-methylphenoxy)-3-butyl-6-methyl-phenyl]menthane, bis[2-(4-aminophenoxy)-3-methylphenyl]-5-menthane, 1-[2-(4-aminophenoxy)-3-methylphenyl]-8-[4-(4-3-aminophenoxy)-3-methylphenyl] menthane, bis[4-(4-amino-phenoxy)phenyl]tricyclo[5,2,1, 0$^{2,6}$]decane, bis[2-(4-aminophenoxy) phenyl]tricyclo[5,2,1, 0$^{2,6}$]decane, [2-(4-aminophenoxy)phenyl]-[4-(4-amino phenoxy)phenyl]tricyclo[5,2,1,0$^{2,6}$]decane, bis[4-(3-3aminophenoxy)-phenyl]tricyclo[5,2,1,0$^{2,6}$]-decane, bis[2-(3-3-amino-(4-amino-phenoxy)-3-methyl phenyl]tricyclo[5, 2,1,0$^{2,6}$]decane, [2-(4-aminophenoxy)-3-methylphenyl]-[4-(4-3-aminophenoxy)-3-methylphenyl]tricyclo[5,2,1,0$^{2,6}$] decane and the like.

Among them, preferable are 1,1-bis[4-(4-amino-phenoxy)-3-t-butyl-6-methylphenyl]butane, bis[4-(4-3-aminophenoxy)phenyl]menthane and bis[4-(4-aminophenoxy)-3,5-dimethylphenyl]tricyclo[5,2,1,0$^{2,6}$] decane.

The diamino compounds represented by the general formula (1), can be used as mixtures with other diamino compounds. Typical examples of the other diamino compounds are as follows: m-phenylenediamine, p-phenylene diamine, 2,4-diaminotoluene, 2,6-diaminotoluene, 3,3'-diaminodiphenyl ether, 3,4'-diaminodiphenylether, 4,4'-diaminodiphenylether, 3,3'-diamino diphenylmethane, 3,4'-diaminodiphenylmethane, 4,4'-diaminodiphenyl methane, 3,3',5,5'-tetrabromo-4,4'-diaminodiphenylmethane, 3,3'- diamino diphenyl sulfide, 3,4'-diaminodiphenylsulfide, 4,4'-diaminodiphenylsulfide, 3,3'-diaminodiphenylsulfon, 3,4'-diaminodiphenylsulfon, 4,4'-diamino diphenylsulfon, 1,3-bis(4-3-aminophenoxy)benzene, 1,4-bis(4-aminophenoxy) benzene, and the like. These amino compounds can be used alone or in admixture of two or more. For good solubility, it is desirable to use the amino compound represented by the formula (1) in about 70% by weight or more, in terms of the sum of the amino compounds.

As the tetracarboxylic dianhydride represented by the general formula (2), all those capable of condensing with the above-mentioned diamino compounds can be applied; however, typical examples thereof are as follows:

Ethylene tetracarboxylic dianhydride, cyclopentane tetracarboxylic dianhydride, pyromellitic dianhydride, 3,3,4,4'-benzophenonetetracarboxylic dianhydride, 2,2,3,3'-benzophenone tetracarboxylic dianhydride, 3,3,4,4'-biphenyl tetracarboxylic dianhydride, 2,2,3,3'-biphenyl tetracarboxylic dianhydride, 3,3',4,4'-diphenylsulfone tetracarboxylic dianhydride, 3,3',4,4'-diphenylhexafluoroisopropane tetracarboxylic dianhydride, 4,4'-oxy diphthalic dianhydride, 2,3,6,7-naphthalene tetracarboxylic dianhydride, 1,4,5,8-naphthalene tetracarboxylic dianhydride, 1,2,5,6-naphthalene tetracarboxylic dianhydride, 2,3,6,7-anthracene tetracarboxylic dianhydride, 1,2,7,8-phenanthrene tetracarboxylic dianhydride, 4-(1,2-dicarboxyethyl)-4-methyl-1,2,3,4-tetrahydro-1,2-naphthalene dicarboxylic dianhydride, 2,2-bis[4-(3,4-dicarboxyphenoxy) phenyl]propane dianhydride, 5-(1,2-dicarboxyethyl)-3-methyl-1,2,5,6-tetrahydrophthalic dianhydride, 6-methyltricyclo[6,2,2,0$^{2,7}$]-dodeca-6,11-diene-3,4,9,10-tetracarboxylic dianhydride and the like. These tetracarboxylic dianhydrides can be used alone or in admixture of two or more.

As the process for producing the polyamide of this invention, any process capable of producing a polyamide can be applied, and preferable is a process comprising reacting a diamino compound with a tetracarboxylic dianhydride in a suitable solvent to obtain a solution of a polyamic acid which is a polyamide precursor, and then thermally or chemically cyclo-dehydrating the polyamic acid in the solution or after casing the solution onto a suitable substrate. The molar ratio of the diamino compound to the tetra-carboxylic dianhydride is in the range of from 1/0.5 to 1/2, and when a high molecular weight polymer is desired to be obtained, the reaction is effected at a molar ratio near 1/1. In order to control the molecular weight, an aromatic monoamine or an aromatic dicarboxylic anhydride can be added to make the terminals non-reactive. Also, in order to improve the character of fire-retardancy or adhesiveness, appropriate reactive type or non-reactive type additives can be used.

The solvent to be used in the synthesis of the polyamic acid and polyimide, any solvent capable of dissolving the above diamino compound and tetracarboxylic dianhydride can be applied; however, typical example thereof are as follows: N-methyl-2-pyrrolidone (referred to hereinafter as NMP), N,N-dimethylacetamide, N,N-diethylacetamide, N,N-di-methyl formamide, dimethyl sulfoxide, N-methyl-ε-caprolactam, γ-butyrolactone, 1,3-dimethyl-2-imidazolidinone, tetramethylurea, hexamethylphosphoramide, m-cresol, p-cresol, o-cresol, xylenol, pyridine, 1,2-dimethoxyethane, tetrahydrofuran, 1,4-dioxane, diglyme and the like. These solvents can be used alone or in admixture of two or more. The concentration is adjusted so as to become about 1 to 50% by weight, preferably about 5 to 20% by weight, in terms of the sum of the weights of the diamino compound and the tetracarboxylic dianhydride. As an azeotropic dehydration solvent in the amidization, it is possible to acid cyclohexane, benzene, toluene, xylene, mesitylene, chlorobenzene, N-cyclohexyl-2-pyrrolidone or the like.

It is desirable to remove water from the raw materials and the solvent by a conventional method beforehand, and conduct the reaction under a dry nitrogen atmosphere. The reaction temperature for the synthesis of polyamic acid is usually 250° C. or lower, preferably 60° C. or lower. The reaction pressure is not critical and the reaction can be satisfactorily carried out at atmospheric pressure. The reaction time may be varied depending upon the kinds of the diamine, acid anhydride and the solvent used, and the reaction temperature; however, it is usually 10 minutes to 24 hours. The polyamic acid obtained is converted to the corresponding polyimide by heating to 100° to 400° C., or alternatively, chemically imidized by treatment with a dehydrating agent such as acetic anhydride in the presence of a catalyst.

When the polyimide is obtained in solution, the solution may be provided to obtain a film of the polyimide, after adding reaction type or non-reaction type additives in it if necessary. Also it is possible to convert the same to a powder by pouring the solution into a poor solvent to precipitate the polyimide. The polyimide powder may be dissolved again in an apropriate solvent.

For preparation of two-layer flexible printed circuit boards, protective coatings or adhesions, the above polyimide solution is coated onto substrates, for example, metal foils, semiconductors, various printed wiring boards, core materials of electric wires and cables, films, clothes by conventional coating method such as coating with coator or doctor blade, spin coating, printing and the like.

Also, the above polyamide solution can be casted and dried on the a substrate to obtain a film, which is, then, peeled off from the substrate and compression molded at the high temperature onto another substrate for use. The compression-molding of polyimide film and substrate is conducted at 160°–400° C., 5–100 kg/cm$^2$ for 5–30 minutes. When the temperature is lower than 160° C., the adhesive strength is not sufficient enough, and when the temperature is higher than 400° C., thermodeterioration of the film may be occur. The preferred temperature is 250°–350° C.

As metal foil materials for two-layer flexible printed circuit board include copper, aluminum, nickel and the like. After adding necessary procession to two-layer flexible printed circuit board as a printed wiring board, polyimide film layer is formed thereon and two-layer flexible printed circuit board with a cover lay can be obtained. Furthermore, these can be applied to double-side or multi-layer flexible printed circuit board or TAB.

Uses as protective coating of the polyimide film in this invention include surface protection of semiconductors, various printed wiring boards and the like, and coating film for electric wires and insulating films between layers.

Uses as adhesions of the polyimide film in this invention include adhesive for engine circumference or brake-lining in airplanes or automobiles; adhesion for parts in semiconductors or flexible printed circuit boards.

DESCRIPTION OF THE PREFERRED EMBODIMENTS

This invention is further explained in more detail below referring to Examples and Comparative Examples; however, this invention should not be interpreted to be limited to the Examples. Incidentally, the measurement method and apparatus used in the Examples and Comparative Examples are as follows:

Inherent viscosity: Ubelohde visocometer was used, by which the flowing down time of 0.5 dl/g solution of the sample in NMP was measured, and calculated according to the following equation.

$\eta_{inh}=[\ln(t/t_0)]0.5$ (dl/g)

t: flowing down time of the solution $t_0$: flowing down time of the solvent

Infrared absorption spectrum: An IR-700 apparatus manufactured by Nippon Bunko Kogyo K. K. was used, by which the powder was measured according to the KBr method and the film was measured as it was.

Solubility: The solubility of 10% of a resin in each solvent was measured at room temperature and at 150° C.

Thereal analysis: A SSC-5200H system manufactured by Seiko Denshi Kogyo K. K. was used.

Thermogravimetry-Differential thermal analysis; An TG/DTA 220 apparatus was used. The thermal decomposition temperature (Td) was measured in the temperature range of from 30° to 600° C. with the heating rate of 10° C./min. in nitrogen atmosphere.

Differential scanning calorimeter; An DSC 220C apparatus was used. The glass transition temperature (Tg) was measured in the temperature range of from 30° to 400° C. with the heating rate of 10° C./min. in nitrogen atmosphere.

Moisture absorbance: A constant temperature humidity incubator (AGX-225, manufactured by Toyo seisakusho K.K.) was used, by which the moisture absorbance was measured at 85° C.×85% for 72 hours.

Dielectric constant, dielectric loss tangent: A LCR meter 4275A apparatus manufactured by Yokogawa-Hewlett-Packard Ltd. was used and a gold electrode was vapor-deposited on both surfaces of a sample. Measurement was conducted at 1 MHz.

Dielectric breakdown: A sample immersed in an insulating oil was inserted between electrodes, and the voltage was increased gradually. The value of dielectric breakdown was calculated as follows:

Dielectric breakdown=Dielectric breakdown voltage/ thickness of the film

Peeling strength: 180° peeling strength was measured at 50mm/min.

Soldering heat resistance: Immersed in a solder bath at a specified temperature, then observed the swelling in the sample.

Adhesive strength in shear by tensile loading: Adhesion layer was formed between two cold rolling steel plates (SPCC-B, 10.0 cm×2.5 cm×1.6 mm, polished with #240 sandpaper and washed with acetone) and heat-pressed to obtain a test piece. Adhesive strength of the test piece was measured at a tensile rate 2 mm/min.

REFERENTIAL EXAMPLE 1

In a 500-ml, four-necked flask equipped with a nitrogen gas-introducing tube, a thermometer and a stirrer were placed 33.8 g (0.06 mole) of 1,1-bis[4-(4-aminophenoxy)-3-t-butyl-6-methylphenyl]butane and 265.8 g of NMP to dissolve the former in the latter, upon which 13.1 g (0.06 mole) of pyromellitic dianhydride was added thereto. The resulting mixture was stirred at room temperature overnight under a nitrogen stream to obtain a polyamic acid solution. The inherent viscosity of the polyamic acid was 1.04 dl/g. Then, the polyamic acid solution heated to 190° C., at which the solution was stirred for five hours under a nitrogen stream (the water formed was removed together with the nitrogen out of the system). The reaction mixture was poured into methanol which was being vigorously stirred to precipitate a resin. The resin was separated by filtration and dried at 150° C. overnight under reduced pressure to obtain a polyamide powder. The inherent viscosity of the polyamide was 0.56 dl/g.

REFERENTIAL EXAMPLE 2

In a 500-ml, four-necked flask equipped with a nitrogen gas-introducing tube, a thermometer and a stirrer were placed 33.8 g (0.06 mole) of 1,1-bis[4-(4-aminophenoxy)-3-t-butyl-6-methylphenyl]butane and 291.3 g of NMP to dissolve the former in the latter, upon which 17.6 g (0.06 mole) of 3,3,4,4-biphenyltetracarboxilic dianhydride was added thereto. The resulting mixture was stirred at room temperature overnight under a nitrogen stream to obtain a polyamic acid solution. The inherent viscosity of the polyamic acid was 0.86 dl/g. Then, the polyamic acid solution heated to 190° C., at which the solution was stirred for five hours under a nitrogen stream (the water formed was removed together with the nitrogen out of the system). The reaction mixture was poured into methanol which was being vigorously stirred to precipitate a resin. The resin was separated by filtration and dried at 150° C. overnight under reduced pressure to obtain a polyimide powder. The inherent viscosity of the polyamide was 0.71 dl/g.

REFERENTIAL EXAMPLE 3

In a 100-ml, four-necked flask equipped with a nitrogen gas-introducing tube, a thermometer and a stirrer were placed 11.3 g (0.02 mole) of 1,1-bis[4-(4-aminophenoxy)-3-t-butyl-6-methylphenyl]butan and 104.6 g of NMP to dissolve the former in the latter, upon which 7.16 g (0.02 mole) of 3,3',4,4'-diphenylsulone tetracarboxilic dianhydride was added thereto. The resulting mixture was stirred at room temperature overnight under a nitrogen stream to obtain a polyamic acid solution. The inherent viscosity of the polyamic acid was 0.92 dl/g. Then, the polyamic acid solution heated to 190° C., at which the solution was stirred for five hours under a nitrogen stream (the water formed was removed together with the nitrogen out of the system). The reaction mixture was poured into methanol which was being vigorously stirred to precipitate a resin. The resin was separated by filtration and dried at 150° C. overnight under reduced pressure to obtain a polyimide powder. The inherent viscosity of the polyimide was 0.77 dl/g.

COMPARATIVE EXAMPLE 1

In a 300-ml, four-necked flask equipped with a nitrogen gas-introducing tube, a thermometer and a stirrer were placed 10.0 g (0.05 mole) of 4,4'-diaminodiphenyl ether and 118.4 g of NMP to dissolve the formerin the latter, upon which 10.9 g (0.05 mole) of pyromellitic dianhydride was added thereto. The resulting mixture was stirred at room temperature overnight under a nitrogen stream to obtain a polyamic acid solution. The inherent viscosity of the polyamic acid was 0.81 dl/g. The part of the polyamic acid solution was cast onto a glass plate and dried at 100° C. overnight under reduced pressure and thereafter heated at 200° C. for one hour under reduced pressure and further at 300° C. for one hour under ventilation to obtain a 30 μm thickness of polyimide film, which was peeled off from the glass plate. Voids and white cloud were not observed in the film, whose appearance was good.

In infrared spectra of the polyamides obtained in Referential Examples 1–3 and Comparative Example 1, the absorbances in the vicinity of 1720 cm$^{-1}$ and 1780 cm$^{-1}$ which are the characteristic absorbance bands of a five membered cyclic imide group, were observed.

Solubility of the polyamides obtained in Referential Examples 1-3 and Comparative Example 1 are shown in Table 1.

TABLE 1

|  | Diglyme | m-cresole | NMP | DMAc | DMF | THF | chloroform |
|---|---|---|---|---|---|---|---|
| Referential Example 1 | ++ | ++ | ++ | ++ | ++ | ++ | ++ |
| Referential Example 2 | ++ | ++ | ++ | ++ | ++ | ++ | ++ |
| Referential Example 3 | ++ | ++ | ++ | ++ | ++ | ++ | ++ |
| Comparative Example 1 | — | — | — | — | — | — | — |

EXAMPLES 1-3

Each NMP solution of the polyamide powders (20% by weight concentration) in Referential Example 1-3, was prepared and cast onto glass plate to form a film. After drying under reduced pressure at 200° C. for 3 hours, all the film peeled off from the glass plate had a good appearance without void and turbidity.

The films obtained in Examples 1-3 and Comparative Example 1 were subjected to measurement of thermal properties, moisture absorbance and electric properties. The results are shown in Table 2.

TABLE 2

|  | Thermal Properties | | Moisture Absorbance | Electric Properties | |
|---|---|---|---|---|---|
|  |  |  |  | ε | tan δ |
|  | Td (°C.) | Tg (°C.) | (%) | (1 MHz) | (1 MHz) |
| Example 1 | 462.0 | 250.5 | 0.12 | 2.91 | 0.005 |
| Example 2 | 453.9 | 249.4 | 0.19 | 2.93 | 0.006 |
| Example 3 | 423.9 | 253.5 | 0.11 | 2.95 | 0.005 |
| Comparative Example 1 | 594.0 | 420.0 | 1.44 | 3.33 | 0.007 |

EXAMPLES 4-6 AND COMPARATIVE EXAMPLE 2

Each polyimide films obtained in Examples 1-3 and Comparative Example 1 was compression-molded onto copper foil under the conditions shown in Table 3. The films used in Examples 4-6 and Comparative Example 2 correspond to the films obtained in Examples 1-3 and Comparative Example 1, respectively.

TABLE 3

|  | Condition of compression molding | Peeling Strength (kgf/cm) |
|---|---|---|
| Example 4 (1) | 290° C. × 20 kg/cm² × 10 min. | 1.74 |
| Example 4 (2) | 275° C. × 20 kg/cm² × 10 min. | 1.08 |
| Example 5 | 275° C. × 20 kg/cm² × 10 min. | 1.68 |
| Example 6 | 275° C. × 20 kg/cm² × 10 min. | 1.57 |
| Comparative Example 2 | 300° C. × 50 kg/cm² × 10 min. | not adhered |

COMPARATIVE EXAMPLE 3

The polyimide film obtained in Comparative Example 1 were adhered to copper foil using Pyralax (Trade name; available from Du Pont) as adhesive agent by compression-molding under the condition of 180° C.×30 kg/cm²×40 min. A three-layer flexible printed circuit board was obtained.

Flexible printed circuit boards obtained in Example 4-6 and Comparative Example 3 were subjected to measurement of soldering heat resistance using the samples which is not treated (ordinary state) and treated under the condition of 85° C.×80%×2 hours. The results are shown in Table 4.

TABLE 4

|  | Ordinary state | | After humidity treatment | |
|---|---|---|---|---|
|  | 300° C. × 1 min. | 300° C. × 10 min. | 260° C. × 1 min. | 300° C. × 1 min. |
| Example 4 (1) | good | good | good | good |
| Example 5 | good | good | good | good |
| Example 6 | good | good | good | good |
| Comparative Example 3 | good | swelled | swelled | swelled and peeled |

EXAMPLES 7–9 AND COMPARATIVE EXAMPLE 4

Each NMP solution of the polyimide powders (15% by weight concentration) in Referential Example 1–3, was prepared and cast onto copper foil of 35 μm thickness to form a film. After drying under reduced pressure at 200° C. for 3 hours, polyimide films of 30 μm thickness were obtained.

Also, the polyamic acid solution in Comparative Example 1 was cast onto copper foil of 35 μm thickness, and polyamide film of 30 μm thickness were obtained after drying over night at 100° C. under reduced pressure, then under reduced pressure at 200° C. for 1 hour, and furthermore at 300° C. for 1 hour under ventilation. All the films obtained above had good appearance without void and turbidity.

The films obtained in Examples 7–9 and Comparative Example 4 were subjected to measurement of dielectric breakdown, peeling strength and soldering heat resistance. The results are shown in Table 5.

TABLE 5

|  | Dielectric Breakdown (kV/mm) | Peeling Strength (kgf/cm) | Soldering Heat Resistance (ordinary state) |
| --- | --- | --- | --- |
| Example 7 | 251 | 1.37 | good |
| Example 8 | 261 | 1.77 | good |
| Example 9 | 255 | 1.63 | good |
| Comparative Example 4 | 260 | 0.82 | good |

Soldering heat resistance is effected at 300° C. × 10 min.

EXAMPLES 10 AND 11

Each NMP solution of the polyamide powders (20% by weight concentration) in Referential Example 1 and 2, was prepared and cast onto glass plate to form a film. After drying under reduced pressure at 200° C. for 3 hours, polyimide films of 80 μm were obtained. These films had good appearance without void and turbidity. Each of these films was cut into 1.25 cm×2.5 cm, inserted between two cold rolling steel plates and adhered by compression-molding at 310° C.×10 kg/cm$^2$×5 min.

COMPARATIVE EXAMPLES 5–8

Resins mixed as shown in Table 6 were coated in molten state between cold rolling steel plates and adhered with curing under the condition in Table 6.

TABLE 6

|  | Resin Mixture |  | Curing Condition |
| --- | --- | --- | --- |
| Comparative Example 5 | Sumiepoxy ELA-128 (100 g) | Bestlex SM-20 (127 g) | 200° C. × 2 hr. |
| Comparative Example 6 | Sumiepoxy ELM-434 (100 g) | 4,4'-DDS (48 g) BF$_3$MEA (1 g) | 180° C. × 6 hr. |
| Comparative Example 7 | Sumiepoxy ESC-500 (100 g) | DICY (4 g) 2P4MZ (2 g) | 140° C. × 3 hr. |
| Comparative Example 8 | Kerimid 601 |  | 200° C. × 5 hr. |

Sumiepoxy ELA-128: Standard epoxy resin available from Sumitomo Chemical Co., Ltd.

Sumiepoxy ELM-434: Heat resistant epoxy resin available from Sumitomo Chemical Co., Ltd.

Sumiepoxy ESC-500: Rubber modified epoxy resin available from Sumitomo Chemical Co., Ltd.

Bestlex SM-20: Imide oligomer having terminal functional group available from Sumitomo Chemical Co., Ltd.

Kerimid 601: Bismaleimide resin available from Rhone-Poulanc Co., Ltd.

4,4'-DDS: 4,4'-diaminodiphenylsulfone

DICY: dicyandiamide

BF$_3$MEA: Boron trifluoride- Monoethylsmine complex

2P4MZ: 2-phenyl-4-methylamidazole

The obtained test pieces were subjected to measurement of adhesive strength in shear by tension loading at 20° C., 200° C. and 240° C.

TABLE 7

|  | Adhesive Strength (kgf/cm$^2$) | | |
| --- | --- | --- | --- |
|  | 20° C. | 200° C. | 240° C. |
| Example 10 | 218 | 167 | 187 |
| Example 11 | 226 | 227 | 185 |
| Comparative Example 5 | 200 | 144 | 27 |
| Comparative Example 6 | 145 | 132 | 73 |
| Comparative Example 7 | 296 | 17 | not measured |
| Comparative Example 8 | 69 | 60 | not measured |

Polyimide film in this invention, and a flexible printed circuit board, a protective coating and a heat resistant adhesion using thereof are excellent in propertied of high heat resistance, high adhesiveness, good insulating property, low moisture absorption, low dielectric property and good processability. The polyimide film is utilized in various industrial fields such as flexible printed circuit boards, protective films for electronic parts or electric wires, and heat resistant adhesions.

What is claimed is:

1. A polyimide film formed from a polyimide which is prepared by the reaction of a diamino compound represented by the general formula (1 or (a);

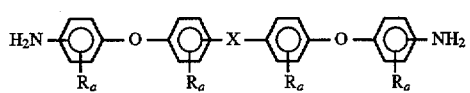 (1)

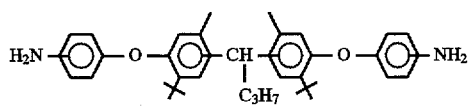 (a)

wherein X represents the formula (b), (c) or (d);

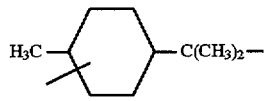 (b)

 (c)

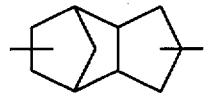 (d)

R represents each independently a halogen atom, a hydrocarbon group having 1 to 6 carbon atoms or a halogen-containing hydrocarbon group having 1 to 6 carbon atoms; a represents each independently an integer of 0 to 4; with a tetracarboxylic dianhydride represented by the general formula (2)

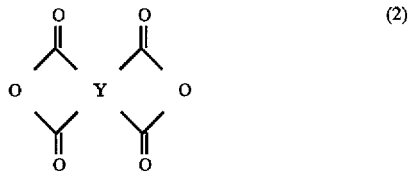 (2)

wherein Y represents a tetravalent organic group having 2 or more carbon atoms.

2. The polyimide film according to claim 1, wherein the ethereal oxygen atom is in the para-position to the amino group.

* * * * *